United States Patent
Lee et al.

(10) Patent No.: US 9,124,199 B2
(45) Date of Patent: Sep. 1, 2015

(54) AUTO CALIBRATION DRIVER IC AND ITS APPLICATION MOTOR DRIVER SYSTEM

(71) Applicant: AMtek Semiconductor Co., Ltd, New Taipei (TW)

(72) Inventors: Teng-Hui Lee, New Taipei (TW); Keng-Yi Wu, New Taipei (TW); Chin-Hung Liu, New Taipei (TW); Chen-Pin Lo, New Taipei (TW)

(73) Assignee: AMtek SEMICONDUCTOR CO., LTD., New Taipei (TW)

( * ) Notice: Subject to any disclaimer, the term of this patent is extended or adjusted under 35 U.S.C. 154(b) by 28 days.

(21) Appl. No.: 14/224,880

(22) Filed: Mar. 25, 2014

(65) Prior Publication Data

US 2015/0155807 A1    Jun. 4, 2015

(30) Foreign Application Priority Data

Nov. 29, 2013  (TW) .............................. 102143697 A

(51) Int. Cl.
*H02P 7/00* (2006.01)
(52) U.S. Cl.
CPC ........................................ *H02P 7/00* (2013.01)
(58) Field of Classification Search
CPC ...... G01R 29/12; G01R 33/07; G01R 15/148; G01R 15/185; G01R 35/00; G01R 35/005; H02P 6/16; H02P 7/00

USPC ........... 318/490, 400.1, 400.13, 400.38, 484, 318/504; 324/200, 202, 205, 207.12, 324/207.13, 207.2, 260

See application file for complete search history.

(56) References Cited

U.S. PATENT DOCUMENTS

| | | | | |
|---|---|---|---|---|
| 5,013,987 A * | 5/1991 | Wakui | ........................... | 318/632 |
| 5,066,911 A * | 11/1991 | Hulsing, II | ............... | 324/207.18 |
| 5,973,468 A * | 10/1999 | Yamauchi | ..................... | 318/610 |
| 7,053,582 B2 * | 5/2006 | Ueyama et al. | ............... | 318/632 |
| 7,746,065 B2 * | 6/2010 | Pastre et al. | .................... | 324/202 |

* cited by examiner

*Primary Examiner* — Bentsu Ro
*Assistant Examiner* — Thai Dinh
(74) *Attorney, Agent, or Firm* — Muncy, Geissler, Olds & Lowe, P.C.

(57) ABSTRACT

A motor driver IC with auto calibration function is provided, the motor driver IC utilizes a Hall sensor of a switched sensor circuit to detect the changes in an external magnetic field. By using the compensation current which is generated by the automatic calibration circuit to correct the unexpected offset existed in the Hall sensor of the sensing unit itself to zero so that the sensing unit can sense the changes in the external magnetic field accurately and can point out the rotor position correctly, and the motor can be further driven to commutate relatively to reduce the motor rotation noise to achieve good output performance of the motor rotation and the better motor driving system stability.

10 Claims, 7 Drawing Sheets

AUTO CALIBRATION DRIVER IC AND ITS APPLICATION MOTOR DRIVER SYSTEM

FIELD OF THE INVENTION

The present invention relates to a driving system and in particular to a motor driving system includes a driving chip with correction functions therein. The motor driving system corrects the offset voltage which is generated by the Hall sensor of a sensing unit to zero, such that the Hall sensor can sense the changes in the external magnetic field accurately and can point out the rotor position correctly and the motor can be further driven to commutate to reduce the motor rotation noise so as to achieve good output performances and better motor driving system stability.

BACKGROUND OF THE INVENTION

Due to technological advancements, the growing popularity of electronic products, the integrated circuit (IC) chips with powerful functions are constantly being introduced. In these electronic products, such as communication devices, notebook computers and household appliances, etc., utilizes the DC motor driver chip with small size and high efficiency, and commonly used in computer CPU, CD-ROM drive and hard disk, etc.

Generally, the drive of the DC motor utilizes a Hall element to sense the motor rotor position, such that the driver can transmit the appropriate commutation signal to rotate the motor rotor. The commutation will directly affect the performance of the overall motor driving system, so that the accuracy of the Hall element sensed the changes in the external magnetic field should be increased to promote the accuracy of the commutation control.

However, after motor driven, Hall element would be influenced by the stress generated on the IC chip surface due to the IC packaging or due to manufacturing changes when subjected to wafer processing (for example, the doping concentration or doping depth is inconsistent) and the external ambient temperature, the Hall element will generate an unexpected offset voltage to cause reliability of the Hall element is decreased, so that the Hall element cannot point out the rotor position accurately to communate. Thereby, the noise will be introduced by the motor rotation and the use of comfort also would be influenced.

According to aforementioned, the unexpected offset voltage is to be eliminated to allow the Hall element that can sense the changes in the external magnetic field accurately and can point out the rotor position correctly and to drive the corresponding communation of the motor to increase the reliability of the communation, and the motor rotation noise is reduced that is the problem should be solved by the present invention.

SUMMARY OF THE INVENTION

In order to solve the aforementioned drawbacks, the major objective of the present invention is to provide a driving chip with correction functions, which utilizes a Hall sensor of the sensing unit to sense the changes in an external magnetic field, and compensation current amount by the gain factor adjusting that is generated by the automatic correction circuit to correct the unexpected offset voltage within the Hall sensor of the sensing unit itself to zero, such that the Hall sensor can sense the changes in the external magnetic field accurately and the external device can also be further driven.

Another major objective of the present invention is to provide a motor driving system which utilizes a Hall sensor of the sensing unit to sense an external magnetic field, and compensation current amount by the gain factor adjusting that is generated by the automatic correction circuit to correct the unexpected offset within the Hall sensor of the sensing unit itself to zero, such that the Hall sensor can sense the changes in the external magnetic field accurately and can point out a rotor position correctly and the motor can be further driven to commutate relatively to reduce the noise which is generated by the motor to achieve good output performance of the motor rotation and the better motor driving system stability.

According to aforementioned objectives, the present invention provides a driving IC (integrated circuit) with correction function which includes a sensing unit, a pre-processing unit, a calculating unit, a gain adjusting unit, and a controlling unit. The sensing unit is provided for sensing the changes in an external magnetic field to generate a first sensing voltage signal and a second sensing voltage signal. The pre-processing unit is provided for receiving and amplifying the first sensing voltage signal and the second sensing voltage signal to output a offset voltage. One terminal of the calculating unit is electrically connected with the pre-processing unit and another terminal of the calculating unit is electrically connected with a reference voltage, and the calculating unit calculates and outputs a first calculating signal or a second calculating signal. The gain adjusting unit is electrically connected with the pre-processing unit to generate a first voltage controlling signal and a second voltage controlling signal. The controlling unit includes a power-on delay circuit, a comparator and an automatic correction circuit. A positive input terminal of the comparator is electrically connected with the gain adjusting unit for receiving the first voltage controlling signal which is generated by the gain adjusting unit and a negative input terminal of the comparator is electrically connected with the gain adjusting unit for receiving the second voltage controlling signal which is generated by the gain adjusting unit. The comparator compares the first voltage controlling signal with the second voltage controlling signal to obtain the offset voltage that belongs to a positive offset voltage or a negative offset voltage and the comparator also outputs a controlling signal to the automatic correction circuit. When the power-on delay circuit counts a counter to a presetting delay time, a start signal is generated to trigger the automatic correction circuit, and at the same time, the gain adjusting unit is triggered by an enabling signal to adjust a gain factor, the automatic correction circuit generate a compensation current that returns to the pre-processing unit to correct the positive offset voltage or the negative offset voltage to zero.

According to above objectives, the present invention provides a motor driving system, which includes a driving IC with correction function which is electrically connected with a motor apparatus. The driving IC includes a sensing unit, a pre-processing unit, a calculating unit, a gain adjusting unit, and a controlling unit. The sensing unit is provided for sensing the changes in an external magnetic field and generating a first sensing voltage signal and a second sensing voltage signal. The pre-processing unit is provided for receiving and amplifying the first sensing voltage signal and the second sensing voltage signal to output a offset voltage. One terminal of the calculating unit is electrically connected with the pre-processing unit and another terminal of the calculating unit is electrically connected with a reference voltage, and the calculating unit calculates and outputs a first calculating signal or a second calculating signal. The gain adjusting unit is electrically connected with the pre-processing unit to generate a first voltage controlling signal and a second voltage controlling signal. The controlling unit includes a power-on delay circuit, a comparator and an automatic correction circuit. A positive input terminal of the comparator is electrically connected with the gain adjusting unit for receiving the first voltage controlling signal which is generated by the gain adjusting unit and a negative input of the comparator is electrically connected with the gain adjusting unit for receiving the second voltage controlling signal which is generated by the gain adjusting unit. The comparator compares the first voltage controlling signal with the second voltage controlling signal to obtain the offset voltage that belongs to a positive offset voltage or a negative offset voltage, and the comparator also outputs a controlling signal to the automatic correction circuit. When the power-on delay circuit counts a counter to a presetting delay time, a start signal is generated to trigger the automatic correction circuit, and at the same time, the gain adjusting unit is triggered by an enabling signal to adjust a gain factor, the automatic correction circuit generate a compensation current that returns to the pre-processing unit to correct positive offset voltage or negative offset voltage to zero.

According to the driving chip with the correction functions and the application of the motor driving system of the present invention, the driving chip can correct the offset voltage generated by the Hall sensor of the sensing unit to zero so that the Hall sensor can sense the changes in the external magnetic field accurately and can point out the rotor position correctly, and the motor can be further driven to commutate to reduce the motor rotation noise so as to achieve good output performances and better motor driving system stability.

BRIEF DESCRIPTION OF THE DRAWINGS

The present invention will be apparent to those skilled in the art by reading the following description of a preferred embodiment thereof with reference to the drawings, in which.

DETAILED DESCRIPTION OF THE PREFERRED EMBODIMENT

The present invention provides a motor driving system which a compensation current amount by gain factor adjusting that is generated by the automatic correction circuit to correct the unexpected offset voltage to zero, in which the unexpected offset voltage is generated by the Hall sensor, such that the Hall sensor can sense the changes in the external magnetic field accurately and can point out the rotor position correctly and the motor can be further driven to commutate relatively. The four sides equivalent resistance of the sensor, for example Hall sensor, will be uneven due to the effects such as manufacturing change, the packaging stress and the changes in operation ambient temperature, such that a offset voltage will be existed in the Hall sensor without external magnetic field so as to when the Hall sensor senses the changes in the external magnetic field, the Hall sensor will generate the sensing voltage signal which includes the offset voltage of Hall sensor itself such that the sensing accuracy of the Hall sensor will be reduced. Thus, the offset voltage belongs to the unexpected offset voltage in this invention. In addition, the basic principle and function of the motor has been understood by who has knowledge of the relevant art with the related technologies. Thus, some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
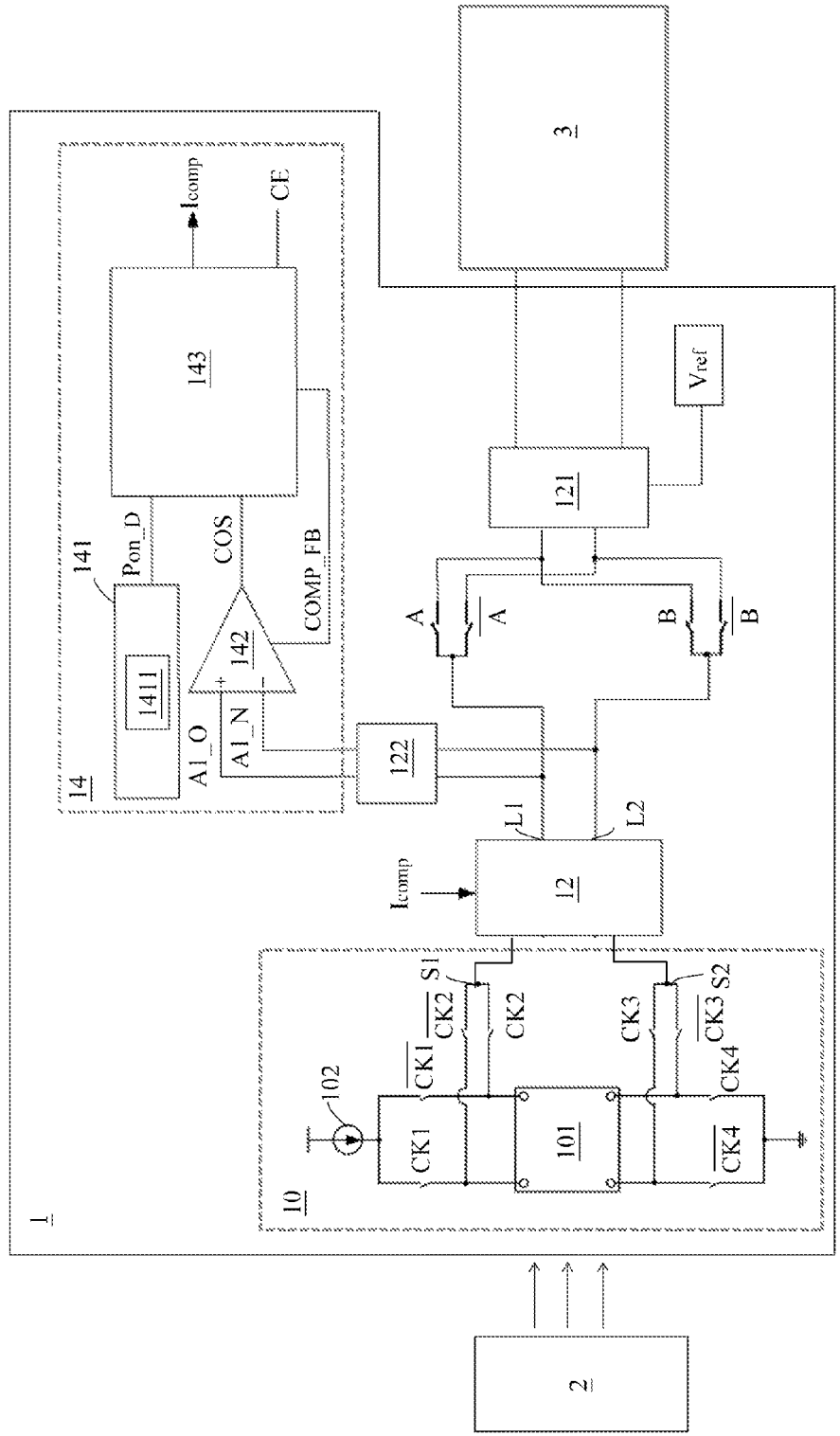
FIG. 1 shows a block diagram of the driving chip with correction function in accordance with the present invention.

Firstly, please refer to FIG. 1. FIG. 1 shows a block diagram of the driving chip with correction functions of the present invention. As shown in FIG. 1, the driving IC 1 includes a sensing unit 10, a pre-processing unit 12, a calculating unit 121, a gain adjusting unit 122 and a controlling unit 14.

Figures 3A, 3B:
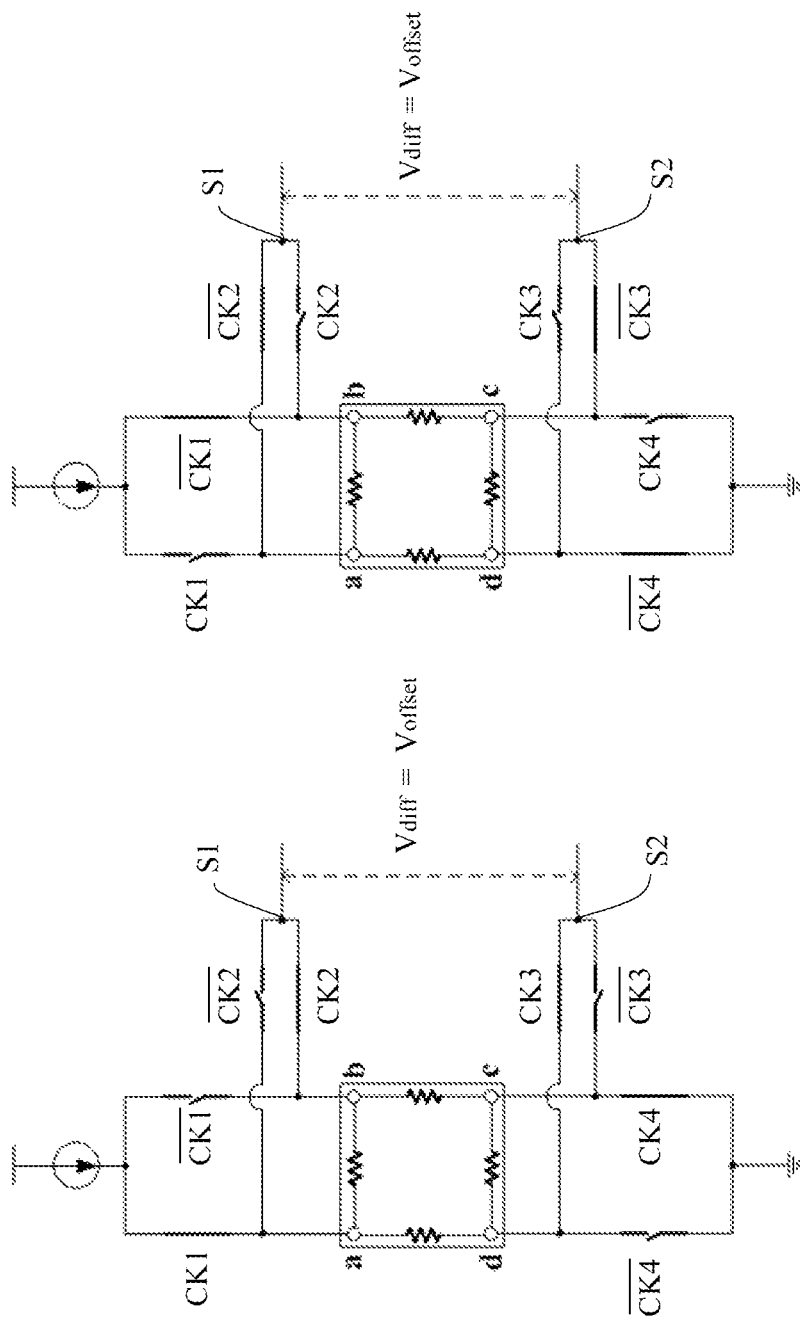
FIG. 3A and FIG. 3B are schematic view of the configuration of the internal sensing unit in accordance with the present invention.

In this embodiment of the present invention, the sensing unit 10 includes a plurality set of switches (CK1, $\overline{CK1}$, CK2, $\overline{CK2}$, CK3, $\overline{CK3}$, and CK4, $\overline{CK4}$), a sensing unit 101 and a power supply 102. The power supply 102 is electrically connected with one terminal of the sensing unit 101 by a first set switches (CK1,$\overline{CK1}$) of the plurality set of switches, and the power supply 102 provides a steady current to the sensing unit 101 to sense the changes in an external magnetic field to generate a first sensing voltage signal S1 and a second sensing voltage signal S2. The first sensing voltage signal S1 and the second sensing voltage signal S2 are outputted by a second set switches (CK2, $\overline{CK2}$) and a third set switches (CK3, $\overline{CK3}$) respectively. Another terminal of the sensing unit 101 is electrically connected with a fourth set switches (CK4, $\overline{CK4}$) of the plurality set of switches and is coupled to a ground terminal. The sensor 101 of the sensing unit 10 can be equivalent to a Resistive Wheatstone Bridge configuration (as shown in FIG. 3A and FIG. 3B) which includes four terminals (a, b, c, d) are electrically connected with an equivalent resistor respectively to configure a bridge circuit. The four terminals (a, b, c, d) are also electrically connected with the plurality set of switches (CK1, $\overline{CK1}$, CK2, $\overline{CK2}$, CK3, $\overline{CK3}$, and CK4, $\overline{CK4}$) respectively. By switching among the plurality set of switches (CK1, $\overline{CK1}$, CK2, $\overline{CK2}$, CK3, $\overline{CK3}$, and CK4, $\overline{CK4}$) with periodically at 90 degree phase difference, when there is no external magnetic field, the four sides equivalent resistance of the sensing unit 101 is not uniformity such that the voltage difference ($V_{diff}$) between the first sensing voltage signal S1 and the second sensing voltage signal S2 is not zero and a offset voltage ($V_{offset}$) is generated. In this case, the voltage difference ($V_{diff}$) is equal to offset voltage ($V_{offset}$). It should be noted that the sensing unit 101 of the present invention is a Hall element, such as a Hall sensor.

According to aforementioned, the first sensing voltage signal S1 and the second sensing voltage signal S2, which are generated by sensing the external magnetic field 2, are inputted to the pre-processing unit 12 in the driving IC 1. The first input terminal and the second input terminal of the pre-processing unit 12 are provided for receiving and amplifying the first sensing voltage signal S1 and the second sensing voltage signal S2 to generate a first amplified voltage signal L1 and a second amplified voltage signal L2. The pre-processing unit 12 outputs an unexpected offset voltage ($V_{offset}$) according to the first output terminal and the second output terminal. In addition, by a first set controlling switches (A, $\overline{A}$) and a second set controlling switches (B, $\overline{B}$) on one terminal of the calculating unit 121 is electrically connected with pre-processing unit 12 to decide the conduction and electrical polarity of the first amplified voltage signal L1 and the second amplified voltage signal L2. Another terminal of the calculating unit 121 is electrically connected with a reference voltage ($V_{ref}$), operation to output a first calculating signal or a second calculating signal to an external device 3 after calculated by the calculating unit 121. In this embodiment of the present invention, the external device 3 is a motor. The gain adjusting unit 122 is also electrically connected with the first output terminal and the second output terminal of the pre-processing unit 12 to generate a first voltage controlling signal (A1_O) and a second voltage controlling signal (A1_N) for the operation of the controlling unit 14. The controlling unit 14 includes a power-on delay circuit 141, a comparator 142 and an automatic correction circuit 143. One positive input terminal of the comparator 142 is electrically connected with the first voltage controlling signal (A1_O) that is generated by the gain adjusting unit 122. A negative input terminal of the comparator 142 is electrically connected with the second voltage controlling signal (A1_N) that is generated by the gain adjusting unit 122. The comparator 142 compares the first voltage controlling signal (A1_O) with the second voltage controlling signal (A1_N) to determine the unexpected offset voltage ($V_{offset}$) that refers to a positive offset voltage ($V_{offset}^+$) or a negative offset voltage ($V_{offset}^-$). A controlling signal (COS) is outputted to the automatic correction circuit 143 through an output terminal of the comparator 142. When the power-on delay circuit 141 counts a counter to a presetting delay time, the automatic correction circuit 143 is triggered by a start signal ($P_{on}\_D$). Aftering the power is turned on, an enabling signal (CE) will trigger the gain adjusting unit 122 to adjust the gain factor of the first amplified signal L1 and the second amplified signal L2 till the end of the operation of the automatic correction circuit 143 and the automatic correction circuit 143 will drive a compensation current generating unit (not shown in FIG. 1) according to the controlling signal (COS) that is outputted by the comparator 142 to conduct the inner plurality of current controlling switches (not shown in FIG. 1) and to obtain sum of compensation current that returns to the pre-processing unit 12, so that the unexpected positive offset voltage ($V_{offset}^+$) or the unexpected negative offset voltage ($V_{offset}^-$) can be corrected to zero.

Figure 2:
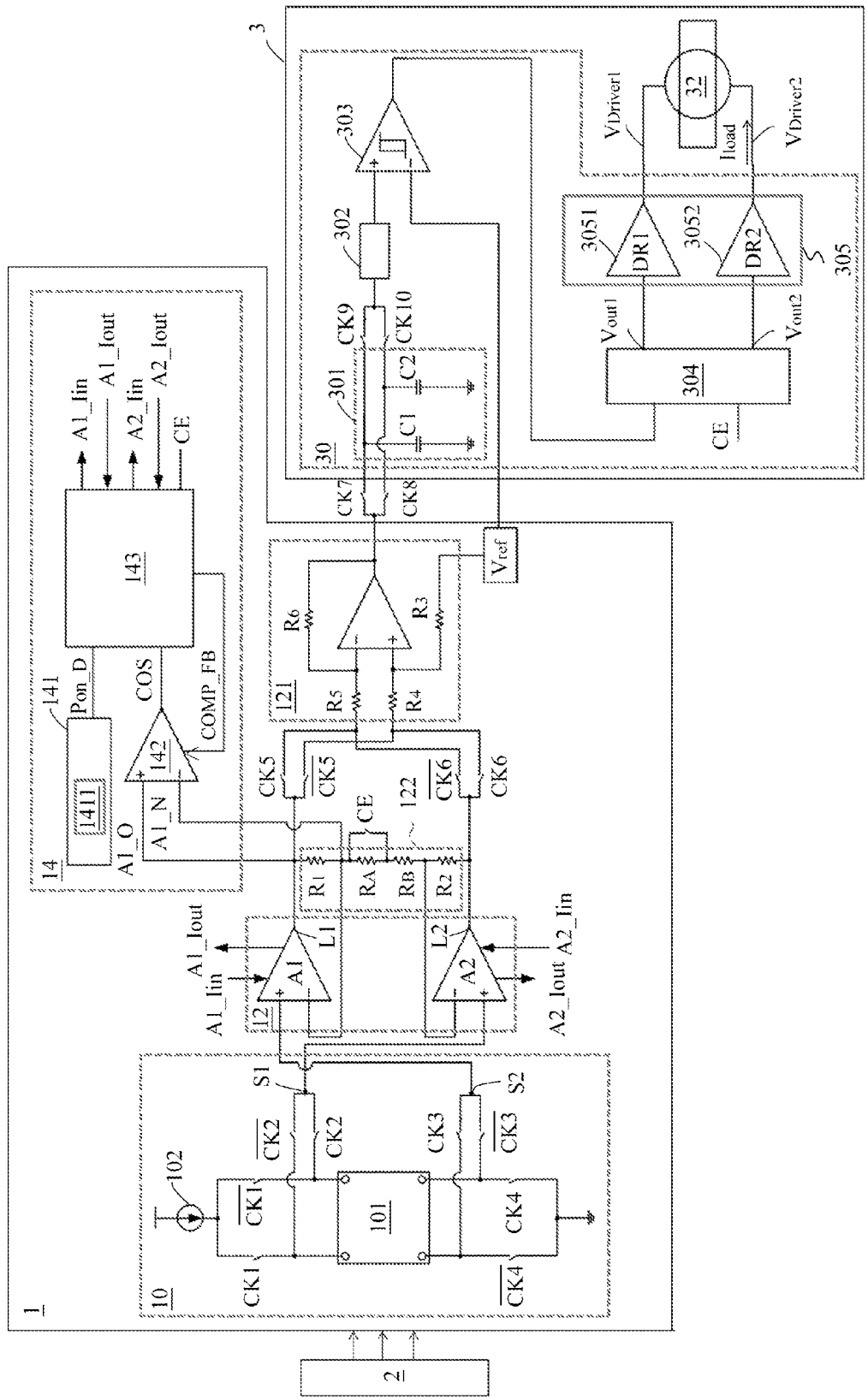
FIG. 2 shows a schematic view of motor driving system in accordance with the present invention.

Please refer to FIG. 2. FIG. 2 shows a schematic view of motor driving system of the present invention. As shown in FIG. 2, the motor driving system is constructed by a driving chip 1 with correction function that is electrically connected with an external device 3 such as motor apparatus. The function and the structure for the driving chip 1 with correction functions are identical with abovementioned FIG. 1, which includes a sensing unit 10, a pre-processing unit 12, a calculating unit 121, a gain adjusting unit 122 and a controlling unit 14. The inside of the sensing unit 10 includes a plurality set of switches (CK1, $\overline{CK1}$, CK2, $\overline{CK2}$, CK3, $\overline{CK3}$, and CK4, $\overline{CK4}$), a sensing unit 101 and a power supply 102. The power supply 102 is electrically connected with one terminal of the sensing unit 101 through a first set switches (CK1, $\overline{CK1}$) of the plurality set of switches and the power supply 102 provides a steady current to the sensing unit 101 for sensing the changes in the external magnetic field 2 to generate a first sensing voltage signal S1 and a second sensing voltage signal S2 and are outputted by controlling a second set switches (CK2, $\overline{CK2}$) and a third set switches (CK3, $\overline{CK3}$). Another terminal of the sensing unit 101 is electrically connected with a fourth set switches (CK4, $\overline{CK4}$) of the plurality set of switches and is coupled to a ground terminal. The first sensing voltage signal S1 and the second sensing voltage signal S2 are outputted from the second set switches (CK2, $\overline{CK2}$) and the third set switches (CK3, $\overline{CK3}$) to the pre-processing unit 12 to be amplified to generate a first amplified voltage signal L1 and a second amplified voltage signal L2 and an unexpected offset voltage ($V_{offset}$) is outputted by the first output terminal and the second output terminal. A first set controlling switches (CK5, $\overline{CK5}$) and a second set controlling switches (CK6, $\overline{CK6}$) on one terminal of the calculating unit 121 are electrically connected with the pre-processing unit 12 to determine the electrically polarity of the first amplified voltage signal L1 and that of the second amplified voltage signal L2 and another terminal of the calculating unit 121 is electrically connected with the reference voltage ($V_{ref}$), operation to output a first calculating signal or a second calculating signal after calculating unit 121 calculated. Then, the first calculating signal or the second calculating signal is outputted to the external device 3 respectively. In one embodiment of the present invention, the external device 3 is a motor apparatus and the external device 3 includes an output controlling unit 30 and a motor 32 connected to the output controlling unit 30. The gain adjusting unit 122 is also electrically connected with the first output terminal and the second output terminal of the pre-processing unit 12 for generating a first voltage controlling signal (A1_O) and a second voltage controlling signal (A1_N) for the operation of the controlling unit 14. The controlling unit 14 includes a power-on delay circuit 141, a comparator 142 and an automatic correction circuit 143. A positive input terminal of the comparator 142 is electrically connected with the first voltage controlling signal (A1_O) that is generated by the gain adjusting unit 122 and a negative input terminal is electrically connected with the second voltage controlling signal (A1_N) that is generated by the gain adjusting unit 122 such that the first voltage controlling signal is compared with the second voltage controlling signal to determine the unexpected offset voltage ($V_{offset}$) that belongs to a positive offset voltage ($V_{offset}^+$) or a negative offset voltage ($V_{offset}^-$). Next, a controlling signal (COS) is outputted by an output terminal of the comparator 142 to the automatic correction circuit 143. When the power-on delay circuit 141 counts a counter 1411 to a presetting delay time, a start signal ($P_{on}\_D$) will generate to trigger the automatic correction circuit 143. During the power is turned on till the end of the operation of the automatic correction circuit 143, an enabling signal (CE) will generate to trigger the gain adjusting unit 122 to adjust the gain factor of the first amplified signal L1 and that of the second amplified signal L2. According to the controlling signal (COS) outputted by the comparator 142, the automatic correction circuit 143 drives a compensation current generating unit (not shown in FIG. 1) to conduct the internal plurality of current controlling switches (not shown in FIG. 1) to obtain sum of compensation current ($I_{comp}$) that returns to the pre-processing unit 12 so that the unexpected positive offset voltage ($V_{offset}^+$) or negative offset voltage ($V_{offset}^-$) is corrected to zero.

In this embodiment, the gain adjusting unit 122 includes a first resistor $R_1$, a first controlling resistor $R_A$, a second controlling resistor $R_B$ and a second resistor $R_2$ in series with each other. A first terminal of the first resistor $R_1$ is electrically connected with the positive input terminal of the comparator 142 and a second terminal of the first resistor $R_1$ is electrically connected with the negative input terminal of the comparator 142. A first terminal of the first controlling resistor $R_A$ is electrically connected with the second terminal of the first resistor $R_1$ and a first terminal of the second controlling resistor $R_B$ is electrically connected with the second terminal of the first controlling resistor $R_A$ and a first terminal of the second resistor $R_2$ is electrically connected with the second terminal of the second controlling resistor $R_B$. The gain adjusting unit 122 which is composed of above four resistors (such as the first resistor $R_1$, the first controlling resistor $R_A$, the second controlling resistor $R_B$, and the second resistor $R_2$) is electrically connected with the first amplifier A1 and a second amplifier A2 of the pre-processing unit 12. In other words, the first amplifier A1 of the pre-processing unit 12 includes a positive input terminal, a negative input terminal and an output terminal, in which the positive input terminal is electrically connected with the third set switches (CK3, $\overline{CK3}$) of the plurality set of switches for receiving the second sensing voltage signal S2 and the negative input terminal is electrically connected with the second terminal of the first resistor $R_1$ of the gain adjusting unit 122. The second sensing voltage signal S2 is amplified by the first amplifier A1 and the first amplified voltage signal L1 is outputted through the output terminal of the first amplifier A1. The second amplifier A2 of the pre-processing unit 12 also includes a positive input terminal, a negative input terminal and an output terminal, in which the positive input terminal of the second amplifier A2 is electrically connected with the second set switches (CK2, $\overline{CK2}$) of the plurality set of switches for receiving the first sensing voltage signal S1 and the negative input terminal is electrically connected with the first terminal of the second resistor $R_2$ of the gain adjusting unit 122. The first sensing voltage signal S1 is amplified by the second amplifier A2 and the second amplified signal L2 is outputted through the output terminal of the second amplifier A2. It should be noted that the resistance of the first resistor $R_1$ is identical with that of the second resistor $R_2$ and the resistance characteristics of the first resistor $R_1$ and the second resistor $R_2$ are the same. The first amplified signal L1 amplified by the first amplifier A1 and the second amplified signal L2 amplified by the second amplifier are electrically connected with the first set controlling switches (CK5, $\overline{CK5}$) and the second set controlling switches (CK6, $\overline{CK6}$) to determine the electrically polarity of the first amplified voltage signal L1 and the second amplified voltage signal L2. Moreover, the calculating unit 121 is an operational amplifier which includes a positive input terminal, a negative input terminal and an output terminal. The positive input terminal receives a reference voltage ($V_{ref}$) through a third resistor $R_3$ and the positive input terminal is arranged in series with a switch ($\overline{CK5}$) of the first set controlling switches (CK5 and $\overline{CK5}$) and a switch (CK6) of the second set controlling switches (CK6, $\overline{CK6}$) through a fourth resistor $R_4$. The negative input terminal is arranged in series with the switch (CK5) of the first set controlling switches (CK5, $\overline{CK5}$) and a switch ($\overline{CK6}$) of the second set controlling switches (CK6, $\overline{CK6}$) through a fifth resistor $R_5$. The output terminal of the calculating unit 121 is electrically connected with the negative input terminal through a sixth resistor $R_6$. The first amplified voltage signal L1 or the second amplified voltage signal L2 is inputted to the calculating unit 121 and the reference voltage signal ($V_{ref}$) to be calculated to generate a first calculating signal or a second calculating signal. The first calculating signal or the second calculating signal is inputted to the external device 3 respectively. It should be noted that the resistance of the third resistor $R_3$ is identical with that of the sixth resistor $R_6$ and the resistance of the fourth resistor $R_4$ is also identical with that of the fifth resistor $R_5$. Thus, the resistance characteristics of above resistors are identical. Furthermore, in this embodiment, the external device 3 includes an output controlling unit 30 and a motor 32 which is connected with the output controlling unit 30. The output controlling unit 30 includes a sample and hold circuit 301, a low-pass filter 302, a hysteresis comparator 303, a logic controller 304 and a load driving circuit 305. The sample and hold circuit 301 is electrically connected with the calculating unit 121 through a first set selecting switches (CK7, CK8) for selectively storing the first calculating signal and the second calculating signal in a first capacitor (C1) and a second capacitor (C2). A first terminal of the first capacitor (C1) is electrically connected with one terminal (CK7) of the first set selecting switches and the second terminal of the first capacitor (C1) is coupled to the ground terminal for storing the first calculating signal, the first terminal of the second capacitor (C2) is electrically connected with the another terminal (CK8) of the first set selecting switches and the second terminal is coupled to the ground terminal for storing the second calculating signal. The low-pass filter 302 is electrically connected with the sample and hold circuit 301 through the second set selecting switches (CK9, CK10) and the first calculating signal in the first capacitor (C1) and the second calculating signal in the second capacitor (C2) are coupled to be a transformation voltage signal. One terminal (CK9) of the second set selecting switches is electrically connected with the node between the one terminal (CK7) of the first set selecting switches of the sample and hold circuit 301 and the first capacitor (C1). Another terminal (CK10) of the second set selecting switches is electrically connected with the node between another terminal (CK8) of the first set selecting switches of the sample and hold circuit 301 and the second capacitor (C2). The hysteresis comparator 303 is electrically connected with the low-pass filter 302 which includes a first hysteresis level and a second hysteresis level, in which a positive input terminal is provided for receiving the transformation voltage signal that is generated by the low-pass filter 302 and a negative input terminal is provided for receiving the reference voltage signal ($V_{ref}$), and the hysteresis comparator switches between the first hysteresis level and the second hysteresis level, and comparing both of input terminal signal to generate a phase controlling signal. Then, the input terminal of a first loading driver (DR1) 3051 and the input terminal of a second loading driver (DR2) 3052 of the load driving circuit 305 receives the first driving signal ($V_{out1}$) and a second driving signal ($V_{out2}$) to generate a first output voltage signal ($V_{Driver1}$), a second output voltage signal ($V_{Driver2}$) and a output current ($I_{load}$) for controlling the rotation of motor 32.

In addition, the driving chip 1 further includes a controlling unit 14. The controlling unit 14 includes a power-on delay circuit 141, a comparator 142 and an automatic correction circuit 143, in which a positive input terminal of the comparator 142 is electrically connected with the gain adjusting unit 122 for receiving the first voltage controlling signal (A1_O) and a negative input terminal is electrically connected with the gain adjusting unit 122 for receiving the second voltage controlling signal (A1_N) to determine the offset voltage that belongs to a positive offset voltage ($V_{offset}^+$) or a negative offset voltage ($V_{offset}^-$). A controlling signal (COS) is outputted to the automatic correction circuit 143 through an output terminal of the comparator 142. When the power-on delay circuit 141 counts a counter 1411 to a presetting delay time, a start signal ($P_{on}\_D$) is generated to trigger the automatic correction circuit 143. During the power is turned on till the end of the operation of the automatic correction circuit 143, an enabling signal (CE) is generated to trigger the gain adjusting unit 122 to adjust a gain factor of the first amplified signal L1 and that of the second amplified signal L2. The automatic correction circuit 143 will drive a compensation current generating unit (not shown in FIG. 2) based on the controlling signal (COS) that is outputted from the comparator 142 to conduct the internal plurality current controlling switches (not shown in FIG. 2) to obtain sum of compensation current ($I_{comp}$). Next, the current direction of a first input current (A1_$I_{in}$), a second input current (A2_$I_{in}$), a first out current (A1_$I_{out}$) and a second output current (A2_$I_{out}$) are controlled by a first current flux controlling switch (not shown in FIG. 2) or a second current flux controlling switch (not shown in FIG. 2), that is the current direction of the compensation current is to be determined. Then, the compensation current is returned to the first amplifier A1 and the second amplifier A2 of the pre-processing unit 12. Then, the first voltage controlling signal (A1_O) and the second voltage controlling signal (A1_N) are generated again and are provided for the comparator 142 to output a controlling signal (COS) so as to control the operation of the automatic correction circuit 143 so that the unexpected positive offset voltage ($V_{offset}^{+}$) or the negative offset voltage ($V_{offset}^{-}$) is corrected to zero.

Figure 4:
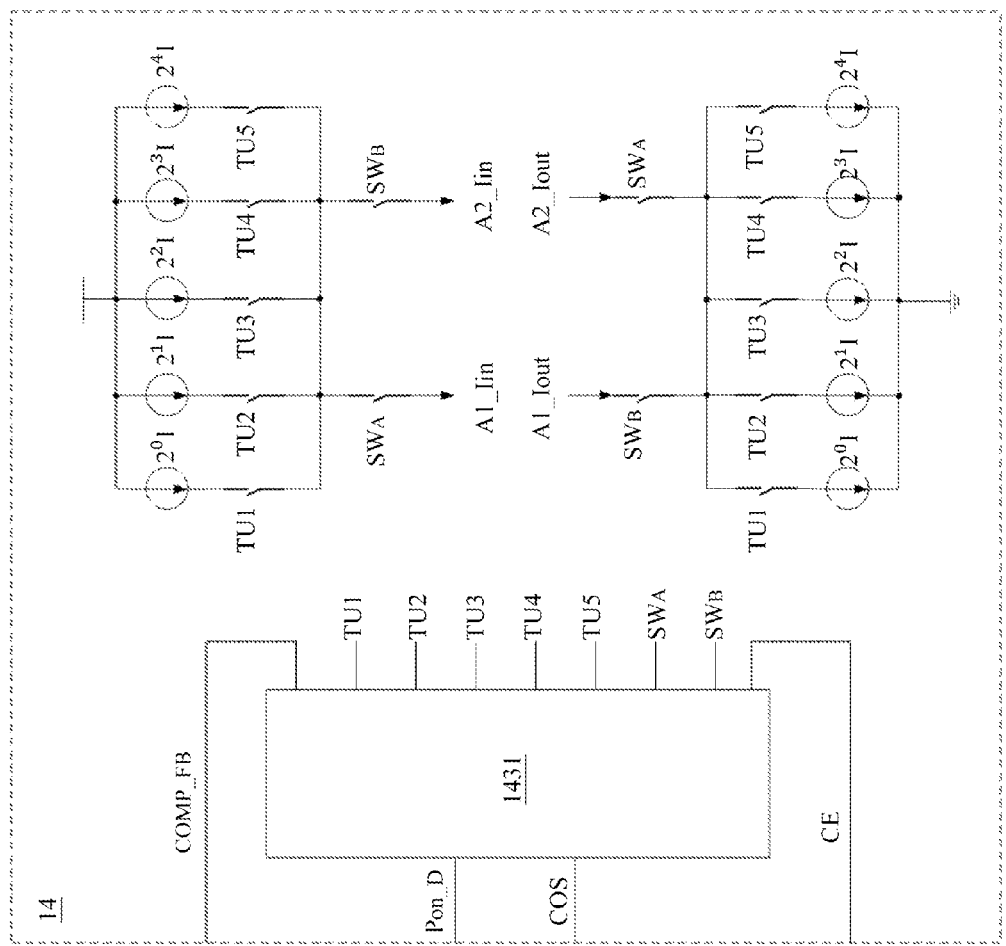
FIG. 4 is a schematic view of configuration of automatic correction circuit controls the circuit in accordance with the present invention.

Next, the actual control circuit configuration for the automatic correction circuit 143 is shown in FIG. 4. FIG. 4 shows the operation of the automatic correction circuit 143 is controlled by a compensation current generating unit 1431. The compensation current generating unit 1431 includes a plurality of pins for the electrical connection, in which the pin of the plurality of pins is provided for electrically connecting with the comparator 142 of the controlling unit 14 and is also provided for receiving the controlling signal (COS) that is outputted from the comparator 142 and another pin of the plurality of pins is provided for electrically connecting with the power-on delay circuit 141 and is provided for receiving the start signal ($P_{on}$_D) that is generated by the power-on delay circuit 141 when the power-on delay circuit 141 counts the counter 1411 to a presetting delay time. During the power is turned on till the end of the operation of the automatic correction circuit 143, an enabling signal (CE) is generated and the compensation current generating unit 1431 is driven based on the controlling signal (COS) that is outputted by the comparator 142 to conduct the internal plurality set of current controlling switches (TU1, TU2, TU3, TU4, and TU5) for loading the corresponding current ($2^0 I$, $2^1 I$, $2^2 I$, $2^3 I$, $2^4 I$) and summing to obtain a compensation current. Then, the compensation current ($I_{comp}$) is returned to the first amplifier A1 and the second amplifier A2 of the pre-processing unit 12 by a first current flux controlling switch ($SW_A$) and a second current flux controlling switch ($SW_B$) which control the current directions of the first input current (A1_$I_{in}$), a second input current (A2_$I_{in}$), a first output current (A1_$I_{out}$) and a second output current (A2_$I_{out}$).

Figure 5:
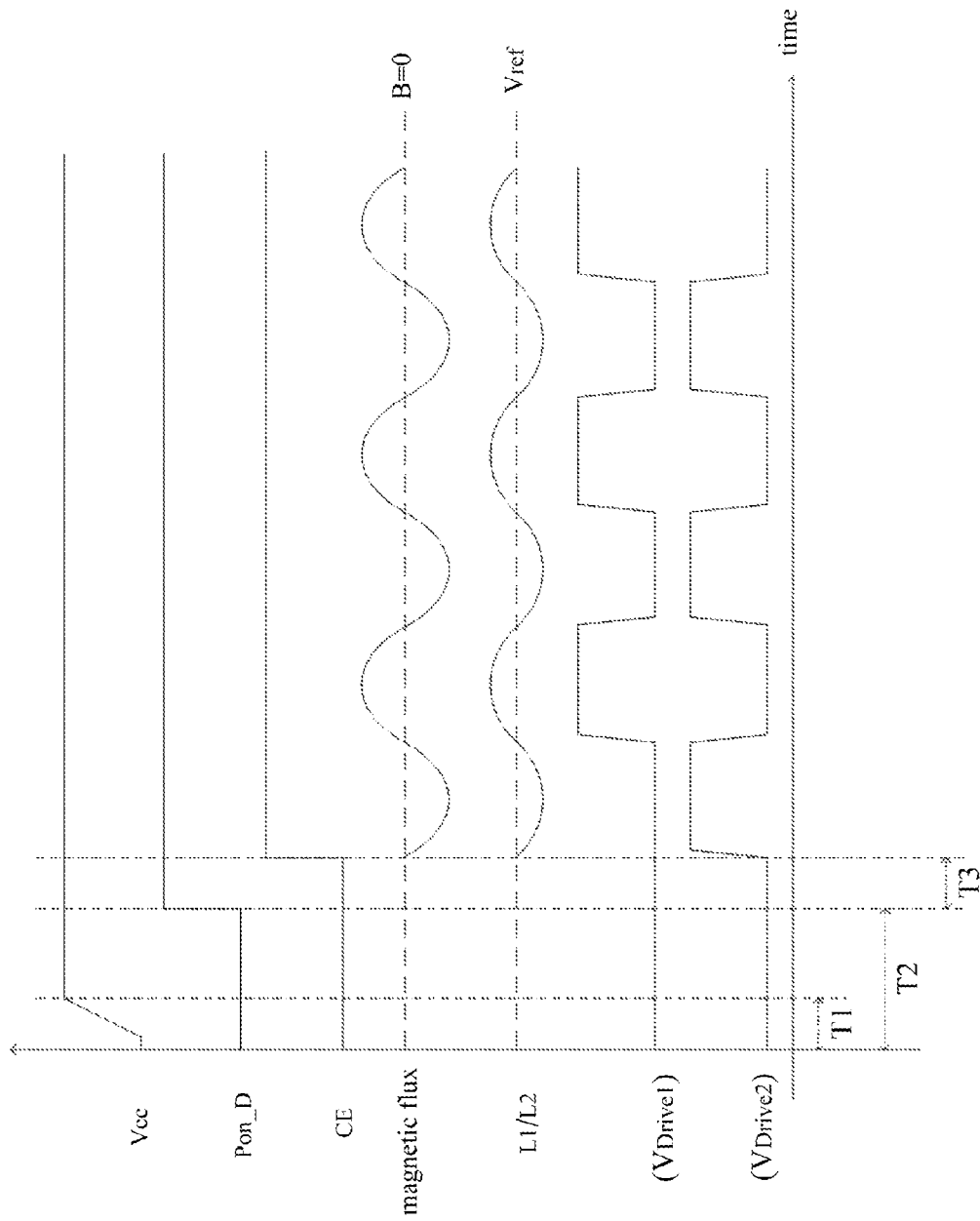
FIG. 5 is a timing chart describing the operation of automatic correction circuit in accordance with the present invention.

Please refer to FIG. 5. FIG. 5 is a timing chart describing the operation of the automatic correction circuit. As shown in FIG. 5, when the power is turned on, the voltage rising time (T1) of the each external power supplies is different and in order to avoid the power of the signal voltage ($V_{cc}$) has not been steady to cause the erroneous operation that is generated by the automatic correction circuit 143. In this embodiment, when the power is turned, the power-on delay circuit 141 counts the internal counter 1411 to a presetting delay time (T2), and the start signal ($P_{on}$_D) changes from the low-voltage level to the high-voltage level that shows the voltage signal ($V_{cc}$) of the power is getting stable so as to notify the automatic correction circuit 143 to be operated. At this time, the automatic correction circuit 143 will complete the correction at correction time (T3). Therefore, during the power is turned on till the end of the automatic correction circuit operation (T2+T3), the enabling signal (CE) will maintain at low-voltage level. It has two objectives of aforementioned, one is the first loading driver (DR1) and the second loading driver (DR2) of the loading driver circuit are closed to allow the first output voltage signal ($V_{Driver1}$) and the second output voltage signal ($V_{Driver2}$) to maintain at low-voltage level to avoid driving the motor stator to rotate the rotor to change the magnetic field to cause the erroneous operation of the automatic correction circuit 143. Another objective is that the gain factor of the first amplifier A1 is significantly reduced for avoiding the magnetic flux of the rotor is accumulated to the offset voltage to affect the correction accuracy of the automatic correction circuit 143.

When the magnetic flux of the external magnetic field is equal to zero (B=0), that means the ideal value of offset voltage ($V_{offset}$) that is generated by the Hall element is equal to zero. At this time, the first voltage controlling signal (A1_O) will equal to the second voltage controlling signal (A1_N) and the compensation current will not be generated by the automatic correction circuit 143 for the first amplifier A1 and the second amplifier A2. However, the Hall element actually includes offset voltage ($V_{offset}$) which means the first voltage controlling signal (A1_O) is not equal to the second voltage controlling signal (A1_N) and the voltage difference between the terminal of first voltage controlling signal (A1_O) and the terminal of the second voltage controlling signal (A1_N) is the gain factor multiplied by offset voltage $$\left( \frac{R1}{(R_A + R_B)} \times V_{offset} \right).$$

Then, the comparator 142 provides a controlling signal (COS) to the automatic correction circuit 143, such that the offset voltage ($V_{offset}$) can be determined to belong a positive offset voltage ($V_{offset}^{+}$) or a negative offset voltage ($V_{offset}^{-}$) by the controlling signal (COS). The first current flux controlling switch ($SW_A$) and the second current flux controlling switch ($SW_B$) are appropriately controlled to provide a compensation current to the first amplifier A1 and a second amplifier A2, such that the unexpected offset voltage ($V_{offset}$) is generated by the Hall element and is corrected to zero ($V_{offset} \cong 0$). When the automatic correction circuit 143 completes the automatic correction, the enabling signal (CE) will change from the low-voltage level to the high-voltage level. The motor driving system will generate a first driving signal ($V_{out1}$) and a second driving signal ($V_{out2}$), the first loading driver (DR1) and the second loading driver (DR2) of the enabling load driving circuit such that the motor rotor is driven to commutate and the gain factor of the first amplifier A1 is changed as $$\frac{R1}{R_B}.$$

Until the next power is re-turned on, the automatic correction circuit 143 is to be reset and re-correct to zero for the unexpected offset voltage ($V_{offset}$) that is generated by the Hall element.

Figure 6:
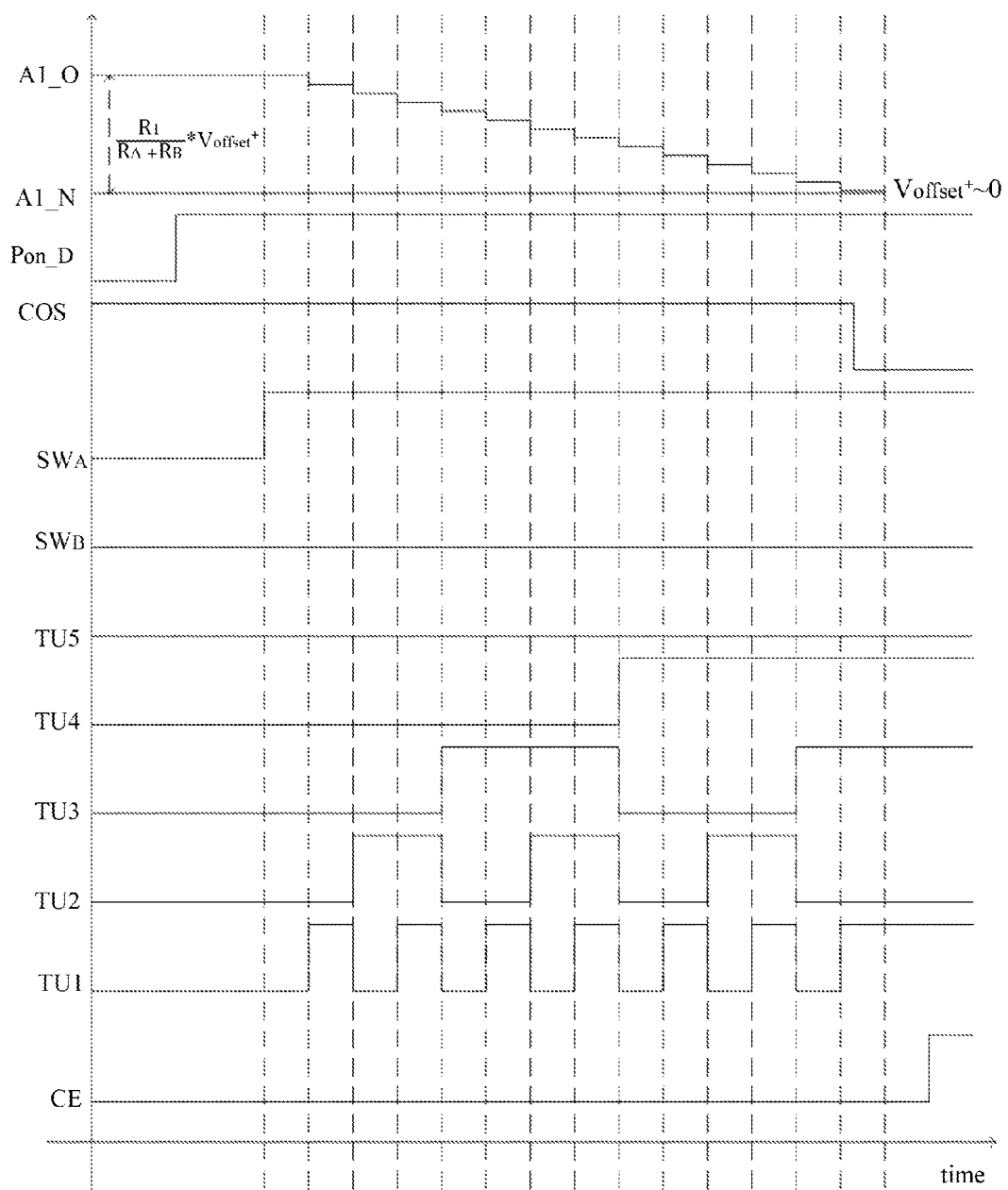
FIG. 6 is a timing chart describing the positive offset voltage correction in accordance with the present invention.

Then, please refer to FIG. 6. FIG. 6 is a timing chart describing the positive offset voltage correction. According to aforementioned, when the power is turned on, the power-on delay circuit will count the counter to a presetting delay time, a start signal ($P_{on}$_D) will change from low-voltage level to the high-voltage level that means the automatic correction circuit 143 is notified to operate. When the comparator 142 provides the controlling signal (COS) to the automatic correction circuit 143, the controlling signal (COS) will maintain at a high-voltage level and the controlling signal (COS) of the comparator 142 determines the offset voltage ($V_{offset}$) that belongs to a positive offset voltage ($V_{offset}^{+}$), that means the first voltage controlling signal (A1_O) is larger than the second voltage controlling signal (A1_N) and voltage difference between the terminal of the first voltage controlling signal (A1_O) and the terminal of second voltage controlling signal (A1_N) is that the gain factor multiplied by the offset voltage $$\left(\frac{R1}{(R_A+R_B)}\times V_{offset}^+\right).$$

At this time, based on the controlling signal (COS) outputted by the comparator 142 to conduct the internal plurality set of current controlling switches (TU1, TU2, TU3, TU4, and TU5) and to load the corresponding current ($2^0$I、$2^1$I、$2^2$I、$2^3$I、$2^4$I) and is summed to obtain a compensation current. The plurality set of current controlling switches (TU1, TU2, TU3, TU4, and TU5) corresponds to the switch timing diagram (the waveform for TU1, TU2, TU3, TU4, and TU5) as shown in FIG. 6. The compensation current of this embodiment can be expressed as $2^0$I*TU1+$2^1$I*TU2+$2^2$I*TU3+$2^3$I*TU4+$2^4$I*TU5. Then, the current directions of the first input current (A1_$I_{in}$), the second input current (A2_$I_{in}$), the first output current (A1_$I_{out}$) and the second output current (A2_$I_{out}$) are controlled by a first current flux controlling switch ($SW_A$) and a second current flux controlling switch ($SW_B$) and the compensation current ($2^0$I*TU1+$2^1$I*TU2+$2^2$I*TU3+$2^3$I*TU4+$2^4$I*TU5) is returned to the first amplifier A1 and the second amplifier A2 of the pre-processing unit, such that the unexpected positive offset voltage ($V_{offset}^+$), which is generated by the Hall element, is corrected periodically to zero ($V_{offset}^+\cong 0$), the positive offset voltage ($V_{offset}^+$) of the Hall element is approximately 0.4 millivolts (mV) that is to be corrected in each period T (T=48µ). In order to avoid the offset voltage becomes negative, the smallest offset voltage such as one bit (1 bit) can be preset by the smallest presetting offset voltage (COMP_FB) within the automatic correction circuit 143. When the automatic correction circuit 143 corrects the offset voltage to the smallest offset voltage (such as one bit), the correction will be stopped. After the correction of the automatic correction circuit 143 has been completed, the plurality set of current controlling switches (TU1, TU2, TU3, TU4, and TU5) will maintain the last set voltage level to provide the compensation current to the first amplifier A1 and the second amplifier A2.

Figure 7:
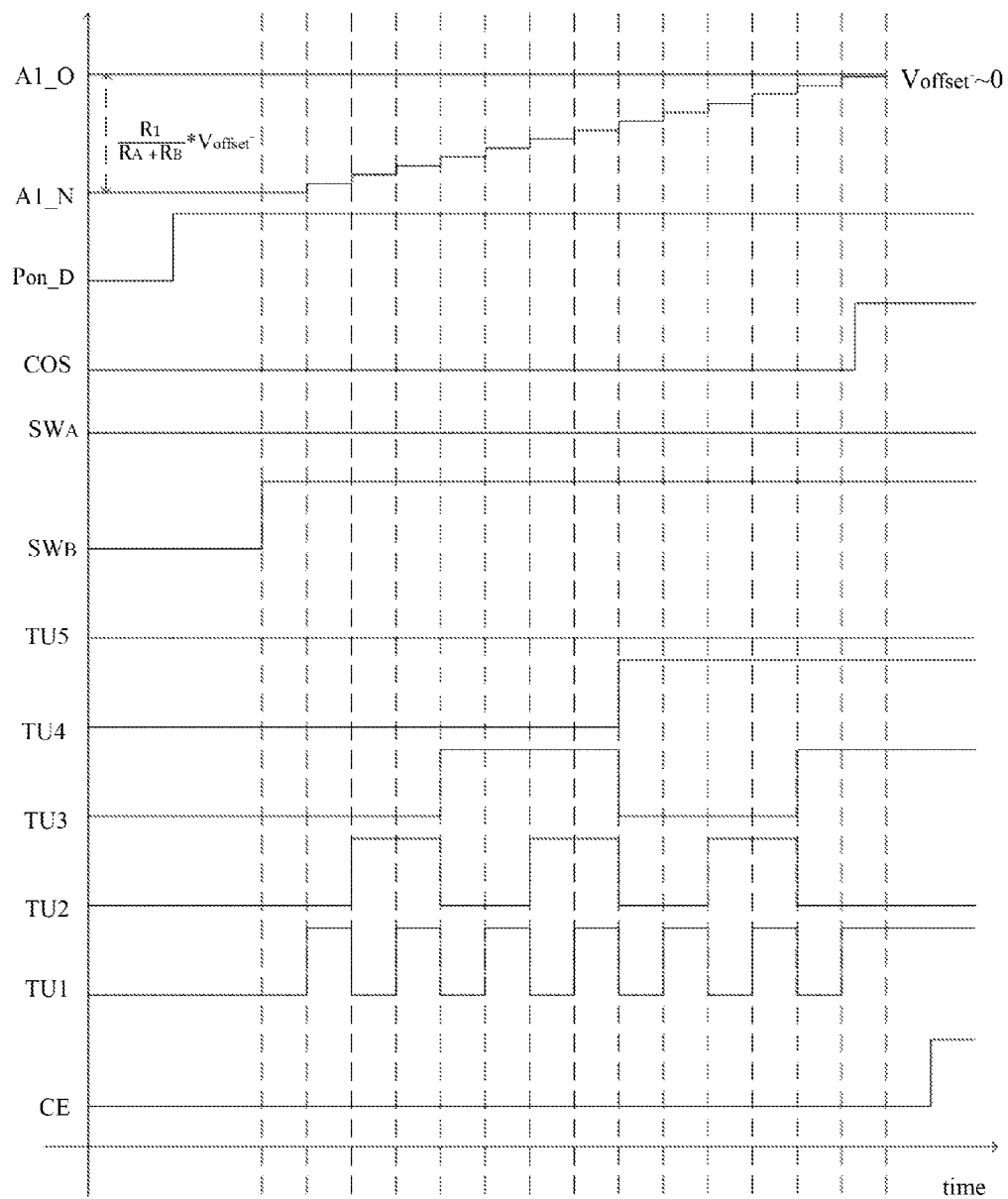
FIG. 7 is a timing chart describing the negative offset voltage correction in accordance with the present invention.

Please refer to FIG. 7. FIG. 7 is a timing chart describing the negative offset voltage correction. As shown in FIG. 7, when the power is turned on, the power-on delay circuit will count the internal counter to a presetting delay time, a start signal ($P_{on}$_D) will become from low-voltage level to high-voltage level to notify the automatic correction circuit 143 that is to be operated. After the comparator 142 provides the controlling signal (COS) to the automatic correction circuit 143, the controlling signal (COS) will maintain at a low-voltage level. The difference from FIG. 6 is that when the controlling signal (COS) of the comparator 142 determines the present offset voltage ($V_{offset}$) belongs to a negative offset voltage ($V_{offset}^-$), that means the second voltage controlling signal (A1_N) is larger than the first voltage controlling signal (A1_O). The voltage difference between the terminals of second voltage controlling signal (A1_N) and the first voltage controlling signal (A1_O) is gain factor multiplied by the offset voltage $$\left(\frac{R1}{(R_A+R_B)}\times V_{offset}^-\right).$$

Meanwhile, based on the controlling signal (COS) that is outputted by the comparator 142 to conduct the internal plurality set of current controlling switches (TU1, TU2, TU3, TU4, and TU5) to load the corresponding current and is summed to obtain compensation current. The plurality set of current controlling switches (TU1, TU2, TU3, TU4, and TU5) corresponds to the switch timing diagram (the waveform for TU1, TU2, TU3, TU4, and TU5) as shown in FIG. 7. The compensation current of this embodiment can be expressed as $2^0$I*TU1+$2^1$I*TU2+$2^2$I*TU3+$2^3$I*TU4+$2^4$I*TU5. Then, the current directions of the first input current (A1_$I_{in}$), the second input current (A2_$I_{in}$), the first output current (A1_$I_{out}$) and the second output current (A2_$I_{out}$) are controlled by a first current flux controlling switch ($SW_A$) and a second current flux controlling switch ($SW_B$) and the compensation current ($2^0$I*TU1+$2^1$I*TU2+$2^2$I*TU3+$2^3$I*TU4+$2^4$I*TU5) is returned to the first amplifier A1 and the second amplifier A2 of the pre-processing unit, such that the unexpected negative offset voltage ($V_{offset}^-$), which is generated by the Hall element, is corrected periodically to zero ($V_{offset}^-\cong 0$), that means the negative offset voltage ($V_{offset}^-$) of the Hall element is approximately 0.4 millivolts (mV) that is to be corrected in each period T (T=48µ). After the correction of the automatic correction circuit 143 has been completed, the plurality set of current controlling switches (TU1, TU2, TU3, TU4, and TU5) will maintain that last set voltage level to provide the compensation current to the first amplifier A1 and the second amplifier A2.

According to aforementioned, for the different operating ambient temperature, the motor driving system of the present invention can correct the offset voltage that is generated by the Hall element to zero and the Hall element can sense the changes in the external magnetic field accurately and can drive the commutation of the motor rotor, such that the rotation efficiency can be increased and the motor rotation noise is reduced to achieve better motor driving system stability.

Although the present invention has been described with reference to the preferred embodiment thereof, it is apparent to those skilled in the art that a variety of modifications and changes may be made without departing from the scope of the present invention which is intended to be defined by the appended claims.

What is claimed is:
1. A driving chip with correction functions, comprising:
a sensing unit, which senses the changes in an external magnetic field and generates a first sensing voltage signal and a second sensing voltage signal;
a pre-processing unit, which receives and amplifies the first sensing voltage signal and the second sensing voltage signal and outputs a offset voltage;
a calculating unit, which includes one terminal that is electrically connected with the pre-processing unit and another terminal of the calculating unit is electrically connected with a reference voltage and outputs a first calculating signal and a second calculating signal;
a gain adjusting unit, which is connected with the pre-processing unit to generate a first voltage controlling signal and a second voltage controlling signal; and
a controlling unit, which includes a power-on delay circuit, a comparator and an automatic correction circuit, wherein a positive input terminal of the comparator is electrically connected with the gain adjusting unit for receiving the first voltage controlling signal and a negative input terminal of the comparator is electrically connected with the gain adjusting unit for receiving the second voltage controlling signal, after comparing the first voltage controlling signal and the second voltage controlling signal, the offset voltage can be determined to belong to a positive offset voltage or a negative offset voltage and outputs a controlling signal to the automatic correction circuit, when the power-on delay circuit counts a counter to a presetting delay time to generate a start signal to trigger the automatic correction circuit and at the same time, an enabling signal is provided for triggering the gain adjusting unit to adjust a gain factor, the automatic correction circuit generate a compensation current that returns to the pre-processing unit to correct the positive offset voltage or the negative offset voltage to zero.

2. The driving chip according to claim 1, wherein the sensing unit further comprising:

a plurality set of switches, one terminal of a first set switches of the plurality set of switches is electrically connected with a power supply and another terminal of the first set switches of the plurality set of switches is electrically connected with a Hall sensor, a second set switches and a third set switches are provided for controlling the output of the first sensing voltage signal and the second sensing voltage signal that are generated by the Hall sensor, and a fourth set switches is electrically connected with another terminal of the Hall sensor and is coupled to a ground terminal.

3. The driving chip according to claim 1, wherein the gain adjusting unit further comprising:

a first resistor, a first terminal of the first resistor which is electrically connected with the positive input terminal of the comparator of the controlling unit and a second terminal of the first resistor is electrically connected with the negative input terminal of the comparator of the controlling unit;

a first controlling resistor, which includes a first terminal and a second terminal, and the first terminal of the first controlling resistor is electrically connected with the second terminal of the first resistor;

a second controlling resistor, which includes a first terminal and a second terminal and the first terminal of second controlling resistor is electrically connected with the second terminal of the first controlling resistor; and a second resistor, which includes a first terminal and a second terminal and the first terminal of the second resistor is electrically connected with the second terminal of the second controlling resistor.

4. The driving chip according to claim 1, wherein the pre-processing unit further comprising:

a first amplifier, which includes a positive input terminal, a negative input terminal and an output terminal, wherein the positive input terminal is electrically connected with the third set switches of the plurality set of switches for receiving the second sensing voltage signal, the negative input terminal is electrically connected with the second terminal of the first resistor of the gain adjusting unit and the second sensing voltage signal is amplified by the first amplifier to become a first amplified signal that is outputted by the output terminal of the first amplifier; and a second amplifier, which includes a positive input terminal, a negative input terminal and an output terminal, wherein the positive input terminal of the second amplifier is electrically connected with the second set switches of the plurality set of switches for receiving the first sensing voltage signal, the negative input terminal of the second amplifier is electrically connected with the first terminal of the second resistor of the gain adjusting unit, and the first sensing voltage signal is amplified by the second amplifier to become a second amplified signal that is outputted by the output terminal of the second amplifier.

5. A motor driving system includes a driving chip with correction functions that is electrically connected with a motor apparatus, wherein the driving chip comprises:

a sensing unit, which senses the changes in an external magnetic field to generate a first sensing voltage signal and a second sensing voltage signal;

a pre-processing unit which receives and amplifies the first sensing voltage signal and the second sensing voltage signal so as to output a offset voltage;

a calculating unit, which includes one terminal of the calculating unit that is electrically connected with the pre-processing unit and another terminal of the calculating unit is electrically connected with a reference voltage and outputs a first calculating signal and a second calculating signal;

a gain adjusting unit which is electrically connected with the pre-processing unit to generate a first voltage controlling signal and a second voltage controlling signal; and a controlling unit, which includes a power-on delay circuit, a comparator and an automatic correction circuit, wherein a positive input terminal of the comparator is electrically connected with the gain adjusting unit for receiving the first voltage controlling signal, a negative input terminal is electrically connected with the gain adjusting unit for receiving the second voltage controlling signal, after comparing the first voltage controlling signal and the second voltage controlling signal, the offset voltage can be determined to belong to a positive offset voltage or a negative offset voltage and outputs a controlling signal to the automatic correction circuit, when the power-on delay circuit counts a counter to a presetting delay time to generate a start signal to trigger the automatic correction circuit and at the same time, an enabling signal is provided for triggering the gain adjusting unit to adjust a gain factor, the automatic correction circuit generate a compensation current that returns to the pre-processing unit to correct the positive offset voltage or the negative offset voltage to zero.

6. The motor driving system according to claim 5, wherein the motor includes an output controlling unit and a motor that is electrically connected with the output controlling unit, and the output controlling unit comprises:

a sample and hold circuit, which is electrically connected with the calculating unit through a first set selecting switches, the sample and hold circuit is provided for storing the first calculating signal and the second calculating signal in a first capacitor and a second capacitor respectively;

a low-pass filter, which is electrically connected with the sample and hold circuit through a second set selecting switches, the low-pass filter is provided for coupling the first calculating signal in the first capacitor and the second calculating signal in the second capacitor to become a transferring voltage signal;

a hysteresis comparator, which is electrically connected with the low-pass filter and the hysteresis comparator includes a first hysteresis level and a second hysteresis level, wherein a positive input terminal of the hysteresis comparator is provided for receiving the transferring voltage signal, a negative input terminal of the hysteresis comparator is provided for receiving the reference voltage signal and the hysteresis comparator switches between the first hysteresis level and the second hysteresis level, and comparing both of input terminal signal to generate a phase controlling signal;

a logic controller, which is electrically connected with the hysteresis comparator and the logic controller transforms the phase controlling signal into a first driving signal and a second driving signal; and a loading driving circuit which includes an input terminal for receiving the first driving signal and the second driving signal to generate a first output voltage signal, a second output voltage signal and an output current for controlling the motor rotation.

7. The motor driving system according to claim 5, wherein the sensing unit further comprising:

a plurality set of switches, one terminal of a first set switches of the plurality set of switches is electrically connected with a power supply and another terminal of the first set switches is electrically connected with a Hall sensor, a second set switches and a third set switches are provided for controlling the outputs of the first sensing voltage signal and the second sensing voltage signal which are generated by the Hall sensor and a fourth set switches is electrically connected with another terminal of the Hall sensor and is coupled with the ground terminal.

8. The motor driving system according to claim 5, wherein the gain adjusting unit further comprising:

a first resistor, which includes a first terminal and a second terminal, the first terminal of the first resistor is electrically connected with the positive input terminal of the comparator of the controlling unit and the second terminal of the first resistor is electrically connected with the negative input terminal of the comparator of the controlling unit;

a first controlling resistor, which includes a first terminal and a second terminal, and the first terminal of the first controlling is electrically connected with the second terminal of the first resistor;

a second controlling resistor, which includes a first terminal and a second terminal, and the first terminal of the second controlling resistor is electrically connected with the second terminal of the first controlling resistor; and a second resistor, which includes a first terminal and a second terminal and the first terminal of the second resistor is electrically connected with the second terminal of the second controlling resistor.

9. The motor driving system according to claim 5, wherein the pre-processing unit further comprising:

a first amplifier, which includes a positive input terminal, a negative input terminal and an output terminal, the positive input terminal is electrically connected with the third set switches of the plurality set of the switches for receiving the second sensing voltage signal, the negative input terminal is electrically connected with the second terminal of the first resistor of the gain adjusting unit and the second sensing voltage signal is amplified by the first amplifier to become a first amplified signal and the first amplified signal is outputted through the output terminal of the first amplifier; and a second amplifier, which includes a positive input terminal, a negative input terminal and an output terminal, the positive input terminal of the second amplifier is electrically connected with the second set switches of the plurality set of switches for receiving the first sensing voltage signal, the negative input terminal is electrically connected with the first terminal of the second resistor of the gain adjusting unit and the first sensing voltage signal is amplified by the second amplifier to become a second amplified signal that is outputted through the output terminal of the second amplifier.

10. The motor driving system according to claim 5, wherein the calculating unit is an operational amplifier which includes a positive input terminal, a negative input terminal and an output terminal, the positive terminal of the operational amplifier receives the reference voltage signal through a third resistor and the positive terminal of the operational amplifier is arranged in series with the first set switches through a fourth resistor, the negative input terminal of the operational amplifier is arranged in series with the second set switches through a fifth resistor and the output terminal of the operational amplifier is electrically connected with the negative input terminal through a sixth resistor.

\* \* \* \* \*